US006692890B2

(12) United States Patent
Huang et al.

(10) Patent No.: US 6,692,890 B2
(45) Date of Patent: Feb. 17, 2004

(54) SUBSTRATE IMPROVEMENTS FOR THERMALLY IMAGEABLE COMPOSITION AND METHODS OF PREPARATION

(75) Inventors: Jen-Chi Huang, Columbus, GA (US); Xing-Fu Zhong, Wallington, NJ (US); S. Peter Pappas, Juno Beach, FL (US); Shashikant Saraiya, Parlin, NJ (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 243 days.

(21) Appl. No.: 09/826,315

(22) Filed: Apr. 4, 2001

(65) Prior Publication Data

US 2002/0172888 A1 Nov. 21, 2002

(51) Int. Cl.[7] ........................ G03F 7/00

(52) U.S. Cl. ..................... 430/270.1; 430/302; 430/303

(58) Field of Search ..................... 430/270.1, 302, 430/303; 205/214

(56) References Cited

U.S. PATENT DOCUMENTS

| | | | | | |
|---|---|---|---|---|---|
| 4,502,925 | A | * | 3/1985 | Walls | 430/276.1 |
| 4,542,089 | A | | 9/1985 | Cadwell et al. | |
| 4,865,591 | A | | 9/1989 | Sams | |
| 4,912,014 | A | | 3/1990 | Feldman | |
| 4,990,428 | A | | 2/1991 | Shimizu et al. | |
| 5,585,416 | A | | 12/1996 | Audett et al. | |
| 5,591,551 | A | | 1/1997 | Audett et al. | |
| 5,616,451 | A | | 4/1997 | Grasshoff et al. | |
| 5,681,683 | A | | 10/1997 | Daems et al. | |
| 5,723,241 | A | | 3/1998 | Ueda | |
| 5,733,704 | A | | 3/1998 | Choi et al. | |
| 5,908,725 | A | | 6/1999 | Ueda | |
| 5,919,601 | A | * | 7/1999 | Nguyen et al. | 430/278.1 |
| 5,922,507 | A | | 7/1999 | Van Damme et al. | |
| 5,998,084 | A | * | 12/1999 | Elsaesser et al. | 430/165 |
| 6,001,536 | A | | 12/1999 | Vermeersch et al. | |
| 6,027,854 | A | | 2/2000 | Nishi et al. | |
| 6,230,621 | B1 | * | 5/2001 | Verschueren et al. | 101/453 |
| 6,238,831 | B1 | | 5/2001 | Hauck et al. | |
| 6,245,421 | B1 | | 6/2001 | Aurenty et al. | |

FOREIGN PATENT DOCUMENTS

| | | | | | |
|---|---|---|---|---|---|
| EP | 0 849 091 | A1 | | 6/1998 | |
| JP | 02-277695 | | | 11/1990 | |
| JP | 02277695 | A | * | 11/1990 | B41M/5/38 |
| JP | 2000327986 | | | 11/2000 | |
| JP | 2001030457 | | | 2/2001 | |
| JP | 2001253179 | | | 9/2001 | |

* cited by examiner

*Primary Examiner*—Janet Baxter
*Assistant Examiner*—Amanda C. Walke
(74) *Attorney, Agent, or Firm*—Faegre & Benson LLP

(57) ABSTRACT

The present invention includes a radiation-imageable element for lithographic printing having a hydrophilic anodized aluminum base with a surface having pores and a image-forming layer having polymer particles coated on the aluminum base. The ratio of the average pore diameter to the average particle diameter is from 0.4:1 to 10:1. The present invention further includes a method of producing the imaged element. The method includes the steps of imagewise exposing the radiation-imageable element to radiation to produce exposed and unexposed regions and contacting the imagewise exposed radiation-imageable element and a developer to remove the exposed or the unexposed regions.

53 Claims, No Drawings

SUBSTRATE IMPROVEMENTS FOR THERMALLY IMAGEABLE COMPOSITION AND METHODS OF PREPARATION

BACKGROUND OF THE INVENTION

1. Field of the Invention

The present invention relates to an imageable element and a method of producing an imaged element that can be used in lithographic printing plates. More particularly, the present invention relates to an imageable element comprising a hydrophilic anodized aluminum base and coated thereon an image-forming layer comprising polymer particles and a method of producing the same.

2. Description of the Prior Art

Lithography is the process of printing from specially prepared surfaces, some areas of which are capable of accepting lithographic ink, whereas other areas, when moistened with water, will not accept the ink. In the art of photolithography, a photographic material is made imagewise receptive to oily inks in the photo-exposed (negative-working) or in the non-exposed areas (positive-working) on a hydrophilic background. The areas which accept ink form the printing image areas and the ink-rejecting areas form the background areas.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers, particularly diazo-sensitized systems, which are widely used. Upon image-wise exposure of the light-sensitive layer the exposed image areas become insoluble and the unexposed areas remain soluble. The plate is then developed with a suitable liquid to remove the diazonium salt or diazo resin in the unexposed areas.

Eurpean Patent Application No. 849,091 A1 and U.S. Pat. No. 6,001,536 disclose thermal coalescence of imageable compositions, including on-press developable compositions. These patent do not contain any disclosure regarding the oxide pore size on the surface of the substrate or the relationship of the oxide pore size to the particle size of the polymer in the image-forming layer.

U.S. Pat. No. 4,990,428 discloses an aluminum substrate having an oxide layer with 35–100 nm pore diameters, obtained by using phosphoric acid as the main electrolyte in the anodization process. When this substrate is overcoated with a free radical photo-polymerizable composition containing carboxylic acid groups and cured, the resulting lithographic plate exhibits superior press life. As above, this patent also does not contain any disclosure regarding the relationship of pore size to particle size of the polymer in the image-forming layer.

U.S. Pat. No. 4,865,951 discloses a bilayer anodic surface produced in a 2-stage process, which affords average pore size diameters of 10–75 nm in the upper layer and substantially greater diameters in the lower layer. A lithographic printing plate comprising an imageable layer on this support is shown to improve stain resistance. However, there is no disclosure regarding the relationship of pore size to particle size.

U.S. Pat. No. 5,922,507 discloses a photosensitive imaging element having a two-phase layer on a support. The two-phase layer has a hydrophilic continuous phase containing a hardened hydrophilic polymer and a dispersed hydrophobic photopolymerizable phase that has a multifunctionally polymerizable monomer and a photoinitiator. The hydrophobic photopolymerizable phase is formed of particles having an average particle size comprised between 0.1 and 10 $\mu$m, i.e., 100–10,000 nm. Neither pore size on the support nor pore size/imaging layer particle size matching are mentioned.

The present invention provides average pore diameter to average particle diameter ratios that can enhance adhesion, which enhances the sensitivity and the press life of the printing plates prepared therefrom.

SUMMARY OF THE INVENTION

The present invention includes a radiation-imageable element for lithographic printing. The radiation-imageable ellement comprises a hydrophilic anodized aluminum base having a surface comprising pores, and coated thereon, an image-forming layer comprising polymer particles, the ratio of said average pore diameter to said average particle diameter being from about 0.4:1 to about 10:1.

The present invention also includes a method of producing an imaged element. The method comprises the steps of:

providing a radiation-imageable element for lithographic printing comprising: a hydrophilic anodized aluminum base having a surface comprising pores; and coated thereon, an image-forming layer comprising polymer particles, the ratio of the average pore diameter to the average particle diameter being from about 0.4:1 to about 10:1; and imagewise exposing the radiation-imageable element to radiation to produce exposed and unexposed regions.

The present invention further includes a method of producing an imaged element having complementary ink receiving and ink rejecting regions. The method comprises the steps of:

providing a radiation-imageable element for lithographic printing comprising: a hydrophilic anodized aluminum base having a surface comprising pores; and coated thereon, an image-forming layer comprising polymer particles, the ratio of the average pore diameter to the average particle diameter being from about 0.4:1 to about 10:1;

imagewise exposing the radiation-imageable element to radiation to produce exposed and unexposed regions; and contacting said imagewise exposed radiation-imageable element and a developer to selectively remove said exposed or said unexposed regions.

The present invention provides average pore diameter to average particle diameter ratios that can enhance the interaction of the image-forming layer with the substrate surface layer following thermal imaging by allowing the polymer particles to enter into the oxide pores of the substrate, thereby enhancing adhesion. The enhanced adhesion, in turn, will enhance the sensitivity and the press life of the printing plates.

DETAILED DESCRIPTION OF THE INVENTION

Lithographic printing is based on the immiscibility of oil and water. Ink receptive areas are generated on the surface of a hydrophilic surface. When the surface is moistened with water and then ink is applied, the hydrophilic background areas retain the water and repel the ink. The ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is thereafter reproduced.

Lithographic printing plate precursors, i.e., imageable elements, typically include an imageable coating applied over the hydrophilic surface of a support material. If after exposure to radiation, the exposed regions of the coating become the ink-receptive image regions, the plate is called a negative-working printing plate. Conversely, if the unexposed regions of the coating become the ink-receptive image regions, the plate is called a positive-working plate. In the present invention, the imagewise exposed regions are rendered less soluble or dispersible in a developer and become the ink-receptive image areas. The unexposed regions, being more readily soluble or dispersible in the developer, are removed in the development process, thereby revealing a hydriphilic surface, which readily accepts water and becomes the ink-repellant image area.

The term "graft" polymer or copolymer in the context of the present invention refers to a polymer which has as a side chain a group having a molecular weight of at least 200. Such graft copolymers can be obtained, for example, by anionic, cationic, non-ionic, or free radical grafting methods, or they can be obtained by polymerizing or co-polymerizing monomers, which contain such groups.

The term "polymer" in the context of the present invention refers to high and low molecular weight polymers, including oligomers, and includes homopolymers and copolymers. The term "copolymer" refers to polymers that are derived from two or more different monomers.

The term "backbone" in the context of the present invention refers to the chain of atoms in a polymer to which a plurality of pendant groups are attached. An example of such a backbone is an "all carbon" backbone obtained from the polymerization of an olefinically unsaturated monomer.

The term "hydrocarbyl" in the context of the present invention refers to a linear, branched or cyclic alkyl, alkenyl, aryl, aralkyl or alkaryl of 1 to 120 carbon atoms, and substituted derivatives thereof. The substituent group can be halogen, hydroxy, hydrocarbyloxy, carboxyl, ester, ketone, cyano, amino, amido and nitro groups. Hydrocarbyl groups in which the carbon chain is interrupted by oxygen, nitrogen or sulfur are also included in the term "hydrocarbyl".

The term "hydrocarbylene" in the context of the present invention refers to a linear, branched or cyclic alkylene, vinylene, arylene, aralkylene or alkarylene of 1 to 120 carbon atoms, and substituted derivatives thereof. The substituent group can be halogen, hydroxy, hydrocarbyloxy, carboxyl, ester, ketone, cyano, amino, amido and nitro groups. Hydrocarbylene groups in which the carbon chain is interrupted by oxygen, nitrogen or sulfur are also included in the term "hydrocarbylene".

The present invention includes a radiation imageable element comprising a hydrophilic, porous oxide base, which is overcoated with an image-forming layer comprising polymer particles. The ratio of the average surface oxide pore diameter of the hydrophilic base to the average particle diameter of the polymer particles is from about 0.4:1 to about 10:1, preferably 0.4:1 to 10:1, more preferably, the ratio is from about 0.5:1 to about 5:1. Radiation can be a photo, thermal or electron beam radiation.

The term "particle" in the context of the present invention refers to a solid, which is dispersed in a continuous phase.

Preferably, the pores have an average pore diameter from about 10 to about 100 nm, more preferably, from about 10 to about 75 nm.

Preferably, the polymer particles have an average particle diameter from about 1 to about 250 nm, more preferably, from about 10 to about 200 nm.

The support material comprises an aluminum or aluminum alloy plate. Suitable aluminum alloys include alloys with zinc, silicon, chromium, copper, manganese, magnesium, chromium, zinc, lead, bismuth, nickel, iron or titanium which may contain negligible amounts of impurities. Preferred plates have a thickness of about 0.06 to about 0.6 millimeters.

The surface of the aluminum plate is preferably subjected to chemical cleaning such as degreasing with solvents or alkaline agents for the purpose of exposing a clean surface free of grease, rust or dust which is usually present on the aluminum surface. Preferably, the surface is grained. Suitable graining methods include glass bead graining, quartz slurry graining, ball graining, the blasting, brush graining and electrolytic graining. Following the graining operation, the support can be treated with an aluminum etching agent and/or a desmutting acid bath.

In a preferred embodiment, the ratio of the average surface oxide pore diameter of the hydrophilic base to the average particle diameter of the polymer particles is from about 0.8:1 to about 10:1 and the incident exposure dose is not more than about 340 mJ/cm$^2$. More preferably, the pore size/particle size ratio is from about 1.0:1 to about 10:1 and the incident exposure dose is not more than about 300 mJ/cm$^2$.

Preferably, the porous oxide base comprises anodized aluminum; the element is free of an interlayer between the porous anodized aluminum base and the image forming layer; the image forming layer also comprises a photothermal conversion material; the heat sensitive polymer particles have a glass transition temperature of at least 50° C., preferably 60° C.; and the image forming layer is negative working.

In another preferred embodiment, the present invention includes a radiation imageable element the ratio of the average surface oxide pore diameter of the hydrophilic base to the average particle diameter of the polymer particles is from about 0.6:1 to about 10:1 and the radiation imageable element is free of an interlayer between the porous anodized aluminum base and the image forming layer.

The porous oxide base is preferably an aluminum sheet comprising at least one anodically oxidized surface. In general, any known method of anodic oxidation, followed by etching, if necessary, that can provide an appropriate pore diameter corresponding to the polymer particles, may be used to prepare the aluminum base.

Anodic pore size for sulfuric acid anodization is typically less than 20 nm whereas anodic pore size for phosphoric acid anodization is typically greater than 30 nm. Typically, lithographic printing plates utilize an aluminum base, which is anodized in sulfuric acid, wherein the average oxide pore size is about 15 nm in diameter. However, phosphoric acid can be used instead of sulfuric acid. Phosphoric acid provides larger anodic pore size and enhances adhesion of photopolymer compositions. The use of large anodic pore substrates that are phosphoric acid anodized is preferred over sulfuric acid-anodized substrates. Other conventional anodization methods can also be used in the preparation of the anodized substrate of the present invention, including particularly those that produce an anodic pore size larger than anodic pore size produced by sulfuric acid anodization.

Thus, preparation of the anodically oxidized surface can be accomplished by anodically oxidizing the aluminum sheet in an aqueous phosphoric or sulfuric acid solution to produce an oxide layer. The anodic oxidation is optionally followed by etching of the the oxide layer to a fraction of its original thickness, such as, for example, to about ½ of its original thickness. Alternatively, a lithographic printing plate precursor can be prepared by the above method.

The anodised aluminum support may be treated to improve the hydrophilic properties of its surface. For example, the aluminum support may be silicated by treating its surface with sodium silicate solution at elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further treatment can include rinsing the aluminum oxide surface with a bicarbonate solution. It is evident that one or more of these post treatments may be carried out alone or in combination.

Examples of the aluminum or aluminum alloy plate of the invention include a plate of pure aluminum and a plate of aluminum alloy with other metal such as silicon, copper, manganese, magnesium, chromium, zinc, lead, bismuth and nickel. The plate in the form of a sheet is preferably used. The aluminum or aluminum alloy plate is preferably grained before the anodic oxidation treatment by the conventional manner, such as brush (mechanical) graining, chemical graining, electrolytic graining and the like. Furthermore, after the anodic oxidation treatment, it may be optionally hydrophilized.

The oxide base comprises oxides and phosphates of aluminum and is present in a coverage of greater than 100 milligrams per square meter of the hydrophilic anodized aluminum base, preferably, greater than 500 milligrams per square meter of the hydrophilic anodized aluminum base. Preferably, the oxide base has a average thickness of at least 0.40 micrometers.

In accordance with the present invention, on top of a hydrophilic surface there is provided a radiation-sensitive image forming layer. Various materials suitable for forming images for use in the lithographic printing process can be used. Any suitable radiation imageable layer, which after exposure and subsequent development, if necessary, can provide an area in imagewise distribution suitable for printing can be used.

Thus, the image forming layer according to the present invention comprises polymer particles, and can further comprise pigments. The polymer particles can be a thermoplastic polymer or thermoset polymer. The thermoplastic polymer can be a hydrophobic polymer or a polymer that has both hydrophobic and hydrophilic segments thereon, such as a graft polymer or copolymer. The thermoset polymer can be a latex particle.

Examples of the polymer particles include:

(1) a thermoplastic homopolymer or copolymer formed from polymerization of one or more monomers selected from: acrylic acid, methacrylic acid, acrylamide, methacrylamide, ester of acrylic acid, ester of methacrylic acid, hydroxyethyl acrylate, hydroxyethyl methacrylate, acrylamide, methacrylamide, N-hydroxyethyl acrylamide, N-hydroxyethyl methacrylamide, styrene, p-hydroxystyrene, α-methylstyrene, p-methylstyrene, vinyl acetate, methyl vinyl ether, ethyl vinyl ether, hydroxyethyl vinyl ether, vinylphosphonic acid, vinyl chloride, vinylidene chloride, acrylonitrile, N-vinyl pyrrolidone and N-vinyl carbazole;

(2) a thermoset polymer, such as, a phenol-formaldehyde resin, a cresol-formaldehyde resin, melamine-formaldehyde resin, a polyurethane resin and a combination thereof;

(3) a graft polymer having hydrophilic and hydrophobic segments, such as, a graft polymer or copolymer having a hydrophobic polymer backbone and a plurality of pendant groups represented by the formula:

-Q-W-Y wherein Q is a difunctional connecting group; W is selected from the group consisting of: a hydrophilic segment and a hydrophobic segment; Y is selected from the group consisting of: a hydrophilic segment and a hydrophobic segment; with the proviso that when W is a hydrophilic segment, Y is selected from the group consisting of: a hydrophilic segment and a hydrophobic segment, with the further proviso that when W is hydrophobic, Y is a hydrophilic segment.

Specific examples of polymer particles for use in connection with the present invention include polystyrene, polyvinyl chloride, polyvinyl acetate, polymethyl methacrylate, polyvinylidene chloride, polyvinyl carbazole, polyacrylonitrile, graft polymer and copolymer particles and mixtures thereof.

The graft copolymer is a thermally sensitive polymer having a hydrophobic polymer backbone and a plurality of pendant groups represented by the formula:

-Q-W-Y wherein Q is a difunctional connecting group; W is selected from the group consisting of: a hydrophilic segment and a hydrophobic segment; Y is selected from the group consisting of: a hydrophilic segment and a hydrophobic segment; with the proviso that when W is a hydrophilic segment, Y is selected from the group consisting of: a hydrophilic segment and a hydrophobic segment, with the further proviso that when W is hydrophobic, Y is a hydrophilic segment.

Preferably, the thermally sensitive graft copolymer comprises repeating units represented by the formula:

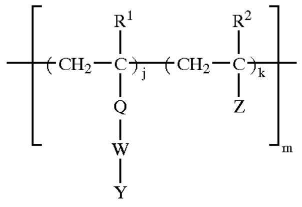

wherein each of $R^1$ and $R^2$ can independently be H, alkyl, aryl, aralkyl, alkaryl, $COOR^5$, $R^6CO$, halogen or cyano.

Q can be one of:

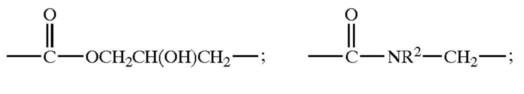

-continued

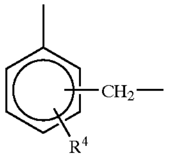

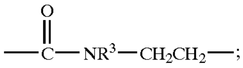
;

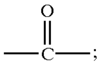
;
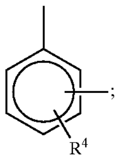
;
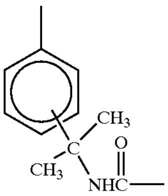
;

wherein $R^3$ can be H or alkyl; $R^4$ can independently be H, alkyl, halogen, cyano, nitro, alkoxy, alkoxycarbonyl, acyl or a combination thereof.

The segment W can be a hydrophilic segment or a hydrophobic segment, wherein the hydrophilic segment can be a segment represented by the formula:

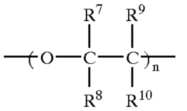
or
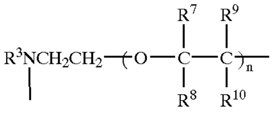

wherein each of $R^7$, $R^8$, $R^9$ and $R^1$ can independently be H or methyl; $R^3$ can be H and alkyl; and wherein the hydrophobic segment can be $—R^{12}—$, $—O—R^{12}—O—$, $—R^3N—R^{12}—NR^3—$, $—OOC—R^{12}—O—$ or $—OOC—R^{12}—O—$, wherein each $R^{12}$ can independently be a linear, branched or cyclic alkylene of 6–120 carbon atoms, a haloalkylene of 6–120 carbon atoms, an arylene of 6–120 carbon atoms, an alkarylene of 6–120 carbon atoms or an aralkylene of 6–120 carbon atoms; $R^3$ can be H or alkyl.

Y can be a hydrophilic segment or a hydrophobic segment, wherein the hydrophilic segment can be H, $R^{15}$, OH, $OR^{16}$, COOH, $COOR^{16}$, $O_2CR^{16}$, a segment represented by the formula:

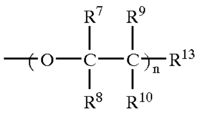
or
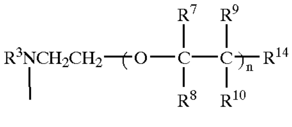

wherein each of $R^7$, $R^8$, $R^9$ and $R^{10}$ can independently be H or methyl; $R^3$ can be H and alkyl; wherein each $R^{13}$, $R^{14}$, $R^{15}$ and $R^{16}$ can be H or alkyl of 1–5 carbon atoms and wherein the hydrophobic segment can be a linear, branched or cyclic alkyl of 6–120 carbon atoms, a haloalkyl of 6–120 carbon atoms, an aryl of 6–120 carbon atoms, an alkaryl of 6–120 carbon atoms, an aralkyl of 6–120 carbon atoms, $OR^{17}$, $COOR^{17}$ or $O_2CR^{17}$, wherein $R^{17}$ can be an alkyl of 6–20 carbon atoms.

Z can be H, alkyl, halogen, cyano, hydroxy, alkoxy, alkoxycarbonyl, hydroxyalkyloxycarbonyl, acyl, aminocarbonyl, aryl and substituted aryl;

j is at least 1;

k is at least 1;

m is at least 2; and n is from 1 to about 500; with the proviso that when W is a hydrophilic segment, Y is a hydrophilic segment or a hydrophobic segment, with the further proviso that when W is hydrophobic, Y is a hydrophilic segment. The substituent in the above substituted aryl can be alkyl, halogen, cyano, alkoxy or alkoxycarbonyl. Preferably, the alkyl group is an alkyl of 1 to 22 carbon atoms.

In another preferred embodiment, the segment W-Y can be represented by the formula:

$$-(OCH_2CH_2)_n-OCH_3$$

wherein n is from 25 to about 75. In this preferred embodiment, the thermally sensitive graft copolymer has, for example, repeating units represented by the formula:

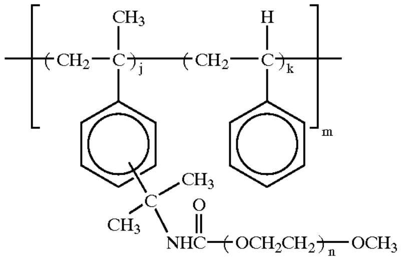

wherein j and k are each at least 1; m is at least 5; and n is from 25 to about 75. More preferably, n has an average value of about 45.

In another preferred embodiment, the thermally sensitive graft copolymer comprises repeating units represented by the formula:

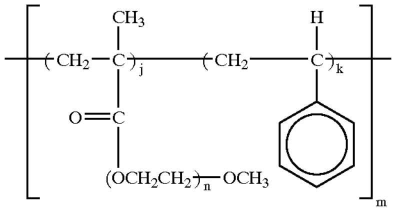

wherein j and k are each at least 1; m is at least 5; and n is from 25 to about 75, more preferably, n has an average value of about 45.

The thermally sensitive graft copolymer having hydrophobic and/or hydrophilic segments can be prepared by known methods.

Other materials that can be useful in this invention include systems that are well known in the art, and include silver halide emulsions, as described in Research Disclosure, publication 17643, paragraph XXV, December, 1978, and references cited therein; polymeric and nonpolymeric quinone diazides as described in U.S. Pat. No. 4,141,733 and references cited therein; light sensitive polycarbonates, as described in U.S. Pat. No. 3,511,611 and references cited therein; diazonium salts, diazo resins, cinnamal-malonic acids and functional equivalents thereof and others described in U.S. Pat. No. 3,342,601 and reference cited therein; light sensitive polyesters, polycarbonates and polysulfonates, as described in U.S. Pat. No. 4,139,390 and references cited therein; and the materials described in the commonly owned U.S. Pat. No. 4,865,951. The contents of these patents are incorporated by reference as fully set forth herein.

Although a negative image formed by thermal coalescence of a heat sensitive polymer is described in the examples that follow, any photo or thermal process, either positive working or negative working, in which polymer particles are involved in the formation of an image is expected to benefit from the present invention. Such processes can include negative working systems wherein, for example, polymer particles are thermally ruptured to produce a crosslinking agent or a reactant. They can also include positive working systems wherein, for example, thermally ruptured polymer particles release a reactant or catalyst which solubilizes a polymer by converting hydrophobic groups into hydrophilic groups, as is the case in the acid-catalyzed unblocking of acid labile esters to produce carboxylic or sulfonic acids. Thus, the present invention can be used in any photo or thermal imaging application.

The polymer particles used in connection with the present invention have a glass transition temperature of at least 40° C., more preferably of at least 50° C. and preferably have a coagulation temperature above 40° C., more preferably of at least 60° C. Coagulation may result from softening or melting of the thermoplastic polymer or graft copolymer particles under the influence of heat. There is no specific upper limit to the coagulation temperature of the polymer particles, however the temperature should be sufficiently below the decomposition of the polymer particles. Preferably, the coagulation temperature is at least 10° C. below the temperature at which the decomposition of the polymer particles occurs. When the polymer particles are subjected to a temperature above coagulation temperature they coagulate to form an agglomerate, which becomes insoluble in aqueous developer.

Preferably, the Number Average Molecular Weight of the polymers, including the graft copolymers, is from about 2,000 to about 2,000,000 and a glass transition temperature of at least 40° C., more preferably, from about 50° C. to about 150° C.

The amount of polymer particles contained in the image forming layer is preferably between 20% by weight and 65% by weight and more preferably between 25% by weight and 55% by weight and most preferably between 30% by weight and 45% by weight.

The polymer particles can be present as a dispersion in the aqueous coating liquid of the image forming layer. An aqueous dispersion of the thermoplastic polymer particles can be prepared by dissolving the thermoplastic polymer in an organic, water immiscible solvent, dispersing the thus obtained solution in water or in an aqueous medium, and removing the organic solvent by evaporation.

Examples of the pigments include: carbon blacks, metal carbides, borides, nitrides, carbonitrides and bronze-structured oxides. Such pigments may absorb radiation in the ultraviolet, visible or infrared spectral regions and may also function as light to heat converting compounds in the present invention.

A light to heat converting compound in connection with the present invention can be preferably added to the image forming layer but at least part of the light to heat converting compound may also be included in a neighbouring layer, if such a layer is present.

Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes and carbon black. The lithographic performance and in particular the print endurance obtained depends on the heat-sensitivity of the imaging element. In this respect it has been found that carbon black yields favorable results.

Classes of materials that are useful as photothermal converters include, but are not limited to, squarylium, croconate, cyanine (including phthalocyanine), merocyanine, chalcogenopyryloarylidene, bis (chalcogenopyrylo) polymethine, oxyindolizine, quinoid, indolizine, pyrylium and metal thiolene dyes or pigments. Other useful classes include thiazine, azulenium and xanthene dyes. Still other useful classes are carbon blacks, metal carbides, borides, nitrides, carbonitrides and bronze-structured oxides. Particularly useful as photothermal converters are infrared absorbing dyes of the cyanine class.

The amount of infrared absorbing compound in the image forming layer is generally sufficient to provide an optical density of at least 0.5 in the layer and, preferably, an optical density of from about 1 to about 3. This range would accommodate a wide variety of compounds having vastly different extinction coefficients. Generally, this is at least 1 weight percent and, preferably, from about 5 to about 30 weight percent.

An imaged element according to the present invention can be produced with or without a development step.

In the first instance, the method of producing an imaged element of the present invention comprises the steps of:

providing a radiation-imageable element for lithographic printing comprising: a hydrophilic anodized aluminum base having a surface comprising pores; and coated thereon an image-forming layer comprising polymer particles, the ratio of the average pore diameter to the average particle diameter being from about 0.4:1 to about 10:1;

imagewise exposing the radiation-imageable element to radiation to produce exposed and unexposed regions; and contacting the imagewise exposed radiation-imageable element and a developer to selectively remove said exposed or said unexposed regions.

In the second instance, the method of producing an imaged element of the present invention comprises the steps of:

providing a radiation-imageable element for lithographic printing comprising: a hydrophilic anodized aluminum base having a surface comprising pores; and coated thereon an image-forming layer comprising polymer particles, the ratio of the average pore diameter to the average particle diameter being from about 0.4:1 to about 10:1; and imagewise exposing the radiation-imageable element to radiation to produce exposed and unexposed regions.

The lithographic printing plate of the present invention can be exposed by conventional methods, for example through a transparency or a stencil, to an imagewise pattern of actinic radiation. Suitable radiation sources include sources rich in visible radiation and sources rich in ultraviolet radiation. Carbon arc lamps, mercury vapor lamps, fluorescent lamps, tungsten filament lamps, photoflood lamps, lasers and the like are useful herein. The exposure can be by contact printing techniques, by lens projection, by reflex, by bireflex, from an image-bearing original or by any other known technique.

Typically, the step of exposing the imageable element to thermal radiation is carried out using an infrared laser. However, other methods such as visible or UV laser imaging may also be used, provided that a photoconverter, i.e., a photothermal converter, is present. Thus, for exposure with such visible or UV radiation sources, the imageable composition generally includes a photothermal converting material. Alternatively, the imageable element of the present invention can be imaged using a conventional apparatus containing a thermal printing head or any other means for imagewise conductively heating the imageable composition, such as, with a heated stylus or with a heated stamp.

The imagewise exposure of the imageable element to thermal radiation is carried out using an exposure dose sufficient for imaging. Typically, an incident exposure dose of from about 50 to about 1000 $mJ/cm^2$ is used in thermal imaging. Preferably, the incident exposure dose is not more than 600 $mJ/cm^2$, more preferably, the incident exposure dose is not more than 400 $mJ/cm^2$ and most preferably, the incident exposure dose is not more than 300 $mJ/cm^2$.

The step of exposure of the imageable element to thermal radiation is followed by a development step preferably using an aqueous developer. The aqueous developer composition is dependent on the nature of the composition of the polymer particles. Common components of aqueous developers include surfactants, chelating agents, such as salts of ethylenediamine tetraacetic acid, organic solvents, such as benzyl alcohol, and alkaline components, such as, inorganic metasilicates, organic metasilicates, hydroxides and bicarbonates. The pH of the aqueous developer is preferably within about 5 to about 14, depending on the nature of the composition of the polymer particles.

For the development step, a diluted alkaline solution optionally containing preferably up to 10% by volume of organic solvent may be used. Examples of alkaline compound include inorganic compound such as sodium hydroxide, potassium hydroxide, lithium hydroxide, sodium silicate and sodium bicarbonate, and organic compound such as ammonia, monoethanolamine, diethanolamine and triethanolamine. Preferable examples of water-soluble organic solvent include isopropyl alcohol, benzyl alcohol, ethyl cellosolve, butyl cellosolve, diacetone alcohol and the like. The developing solution may contain a surfactant, dye, salt for inhibiting the swelling or salt for corroding the metal substrate.

Following development, a postbake may optionally be used to increase press life. In the practice of the present invention, a post-exposure, pre-development heat step may also be used. This pre-development heat step can further aid in increasing differentiation between exposed and unexposed areas.

In addition to the imageable layer, the imageable element can have additional layers, such as, an overlying layer. Possible functions of an overlying layer include:

(1) to prevent damage, such as scratching, of the surface layer during handling prior to imagewise exposure; and (2) to prevent damage to the surface of the imagewise exposed areas, for example, by over-exposure which could result in partial ablation.

The overlying layer should be soluble, dispersible or at least permeable to the developer.

The present invention enhances interaction of the image-forming layer with the substrate surface layer, thereby enhancing press life. The results suggest that, if the heat sensitive particles are able to enter into the oxide pores of the substrate, an enhanced adhesion would result following imaging.

Lithographic plates prepared by photochemical processes in which photopolymerizable polymer particles are employed in image formation, such as the no-process plate described in U.S. Pat. No. 5,922,507, are expected to benefit from this substrate oxide pore-size/imaging layer particle size matching described in the present invention. In addition, photo and thermal imaging compositions, in which polymer particles are not involved in image formation, but rather are used to reinforce and enhance durability of the image, can also benefit from this approach.

The present invention provides average pore diameter to average particle diameter ratios that can enhance the interaction of the image-forming layer with the substrate surface layer following thermal imaging by allowing the polymer particles to enter into the oxide pores of the substrate, thereby enhancing adhesion. The enhanced adhesion, in turn, will enhance the sensitivity and the press life of the printing plates.

Without being bound by any theory, it is believed that the ability of the polymer particles to enter the oxide pores enhances adhesion of the imageable layer to the anodized aluminum base following thermal or photo imaging. Thus, including an interlayer between the imageable layer to the anodized aluminum base would reduce the ability of the particles to enter the pores and increasing the incident exposure dose would enhance the ability of the particles to enter the pores.

The present invention provides a radiation imageable composition that is useful in photo or thermal imaging of, for example, lithographic plates and printed circuit boards.

The invention is further described in the following examples, which are intended to be illustrative and not limiting.

EXAMPLE 1

A polystyrene-co-poly (acrylic acid) latex having an average particle diameter of 37 nm was synthesized as follows. A mix of initiator (ammonium persulfate, 1.6 g) and surfactant (sodium dodecyl sulfate, 3.0 g) in distilled water (520 g) was stirred mechanically with a glass-Teflon stirrer in a 1 L round bottom flask under $N_2$ and heated to 70° C. The monomer mixture (styrene, 137 g, and acrylic acid, 13.5 g) was added over 3–4 hr, after which the polymerization was allowed to continue for an additional 2–3 hr. The resulting latex was dialyzed against distilled water containing a small amount of ammonium hydroxide to remove the excess sodium dodecyl sulfate. The latex particle diameters were measured on a Microtac Ultrafine Particle Analyzer at 25° C. and were in the range of about 30–40 nm, with an average diameter of about 37 nm.

EXAMPLE 2

A polystyrene-co-poly (acrylic acid) latex having an average particle diameter of about 15 nm was synthesized as follows. The procedure of example 1 was repeated except that 38.0 g of sodium dodecyl sulfate was used in place of 3.0 g of the surfactant. Following prolonged dialysis to remove excess surfactant, the latex particle diameters were found to be in the range of about 10–20 nm, with an average diameter of about 15 nm.

EXAMPLE 3

The polystyrene-co-poly (acrylic acid) latex of Example 2 (15 g) was diluted in distilled water (450 g), stirred mechanically under $N_2$ and heated to 70° C. in a 1-L round bottom flask. A solution of ammonium persulfate (2 g) in distilled water (15 g) was added, followed by the dropwise addition of styrene (165 g) over 3 hr. The polymerization mixture was heated at 70° C. for an additional 2 hr and allowed to cool to room temperature, after which aqueous 30% ammonium hydroxide (20 g) was added. The latex particles were estimated to have an average diameter of about 60 nm, based on the ratio of monomer to surfactant utilized.

EXAMPLE 4

A carbon black dispersion was prepared as follows. A solvent mix of distilled water (4.5 kg), 2-propanol (6.0 kg) and ammonium hydroxide (28–30% ammonia) (1.5 kg) was prepared. One third of the solvent mixture was placed in a blender to which carbon black CWA (55% pigment, available from Ciba) (3 kg) was slowly added with mechanical stirring. Stirring was continued for 10 min, after which the mixture was diluted to 40% solids with the above solvent mix and passed through a shot mill for three consecutive times. Subsequently, the dispersion was further diluted with the remaining solvent mix to provide about 20% solids. The average particle diameter of the carbon black was about 250 nm.

EXAMPLE 5

Thermally sensitive coating formulations of the carbon black dispersion with each of the above latexes were prepared as follows. The carbon black dispersion of Example 4 (20.7% solids) (24.2 g) was mixed with the latex of example 1 (11.5% solids) (71.3 g); the mixture was stirred for 30 min and filtered to provide coating-1, which contains latex particles having an average diameter of about 37 nm.

In a similar manner, the carbon black dispersion was mixed with the latex of Example 2 to provide coating-2 and the latex of Example 3 to provide coating-3. Coating-2 and coating-3 contain latex particles having an average diameter of about 15 nm and about 60 nm, respectively.

EXAMPLE 6

Thermally sensitive printing plates were prepared and press tested as follows. Aluminum sheets were electrolytically grained in 1% hydrochloric acid, alkaline washed to remove the smut, and then anodized in 20% sulfuric acid at 30–40° C. to provide an oxide weight of 2.5 g/m$^2$. The porous anodic oxide surface exhibited average pore diameters in the range of about 10–20 nm.

One of the anodized sheets was post-treated with a sodium silicate solution to provide a silicate interlayer. Another of the sheets was post-treated with a polyvinyl phosphonic acid (PVPA) solution to provide a PVPA interlayer. Coating-1, which contains latex particles having average diameters of about 37 nm, as described in Example 4, was spin-coated on each of these bases to provide coating weights of 1.2 g/m$^2$. A third sheet was directly spin-coated with coating-1 with no post-anodic interlayer.

The coated bases were imagewise exposed in a Creo Trendsetter 3244 imagesetter, utilizing a laser diode array emitting at 830 nm. A power setting of 10.5 W and variable drum speeds were used to expose each of the plate precursors in increments of 20 mJ/cm$^2$ between 200 and 320 mJ/cm$^2$. The exposed plate precursors were subsequently developed using developer 955 (available from Kodak Polychrome Graphics) and mounted on a sheet-fed printing press. In both cases, for exposure doses less than 280 mJ/cm$^2$, the exposed image area was removed during development. The plates exposed to higher exposure doses were mounted on a sheet-fed printing press.

Less than 100 clean impressions of poor image quality were obtained.

EXAMPLE 7

The silicated anodized sheet of Example 6 was soaked in 5% citric acid for 3 minutes, followed by 3 consecutive rinses with deionized water, to provide an acid-washed silicated base, which was spin-coated with coating-1, as described in Example 6.

The resulting coated base and the coated bases of Example 6 were imagewise exposed in the Creo 3244 imagesetter between 340–460 mJ/cm$^2$ in 20 mJ/cm$^2$ increments, developed and mounted on a sheet-fed printing plate, as described in Example 6.

Less than 100 clean impressions of poor image quality were obtained with the plates, which were interlayered with silicate and PVPA. However, more than 10,000 good impressions were obtained with the plates having no interlayer and the acid-washed silicate interlayer at the higher exposure dose ranges.

The results of Examples of 6 and 7, together with those of the subsequent reactions are summarized in Table 1.

TABLE 1

Summary of Results[1]

| Ex | Anodizing acid: Average pore size (nm) | Interlayer | Average particle size (nm) | Dose (mJ/cm$^2$) | Clean Impressions | Pore size/ particle size ratio |
|---|---|---|---|---|---|---|
| 6 | Sulfuric: 15 | Silicate | 37 | 200–320 | <100 | 0.40 |
| 6 | Sulfuric: 15 | PVPA | 37 | 200–320 | <100 | 0.40 |
| 6 | Sulfuric: 15 | None | 37 | 200–320 | <100 | 0.40 |
| 7 | Sulfuric: 15 | Silicate | 37 | 340–460 | <100 | 0.40 |
| 7 | Sulfuric: 15 | PVPA | 37 | 340–460 | <100 | 0.40 |
| 7 | Sulfuric: 15 | None | 37 | 340–460 | >10,000 | 0.40 |
| 7 | Sulfuric: 15 | Silicate Acid Washed | 37 | 340–460 | >10,000 | 0.40 |
| 8 | Sulfuric: 15 | Silicate | 15 | 340–460 | >10,000 | 1.0 |
| 8 | Sulfuric: 15 | PVPA | 15 | 340–460 | >10,000 | 1.0 |
| 8 | Sulfuric: 15 | None | 15 | 340–460 | >10,000 | 1.0 |
| 9 | Phosphoric: 37 | Polyacrylic acid | 37 | 200–320 | 100,000 | 1.0 |
| 9 | Phosphoric: 37 | None | 37 | 200–320 | 120,000 | 1.0 |
| 9 | Phosphoric: 37 | None | 15 | 200–320 | 150,000 | 2.5 |
| 11 | Phosphoric: 37 | Polyacrylic acid | 60 | 260–340 | <100 | 0.62 |
| 11 | Phosphoric: 37 | None | 60 | 260–340 | <100 | 0.62 |
| 11 | Phosphoric: 37 | Polyacrylic acid | 60 | 380–460 | 100,000 | 0.62 |
| 11 | Phosphoric: 37 | None | 60 | 380–460 | 100,000 | 0.62 |
| 12 | Sulfuric (phospho-ric etch): 35 | Silicate | 37 | 200–320 | 120,000 | 0.95 |
| 12 | Sulfuric (phospho-ric etch: 35 | PVPA | 37 | 200–320 | 120,000 | 0.95 |

TABLE 1-continued

Summary of Results[1]

| Ex | Anodizing acid: Average pore size (nm) | Interlayer | Average particle size (nm) | Dose ($mJ/cm^2$) | Clean Impres-sions | Pore size/ particle size ratio |
|---|---|---|---|---|---|---|
| 12 | Sulfuric (phospho-ric etch): 35 | None | 37 | 200–320 | 120,000 | 0.95 |
| 13 | Sulfuric (phosphor-ic etch) sulfuric: 20 | Silicate | 30 | 240–320 | <1000 | 0.67 |
| 13 | Sulfuric (phosphor ic etch) sulfuric: 20 | PVPA | 30 | 240–320 | <1000 | 0.67 |
| 13 | Sulfuric (phosphoric etch) sulfuric: 20 | None | 30 | 240–320 | 100,000 | 0.67 |
| 15 | Sulfuric (phosphoric etch) phosphoric: 35 | Silicate | 30 | 240–320 | 50,000 | 1.2 |
| 15 | Sulfuric (phosphoric etch) phosphoric: 35 | PVPA | 30 | 240–320 | 50,000 | 1.2 |
| 15 | Sulfuric (phosphoric etch) phosphoric: 35 | None | 30 | 240–320 | 90,000 | 1.2 |

[1]Examples 6–9, 11 and 12 utilize coating-1, coating-2 or coating-3, described in Example 5. Examples 13 and 15 utilize coating-4, described in Example 14.

EXAMPLE 8

Anodized sheets of Example 6 and 7, with no interlayer, as well as with silicate, PVPA and acid-washed silicate interlayer, were spin-coated with coating-2, which contains latex particles having average particle diameters of about 15 nm, to provide coating weights of 1.2 $g/m^2$. Each of these 4 bases was then imagewise exposed, developed and mounted on a sheet-fed printing press as described in Example 6. All plates, which were exposed at the higher doses of 340–460 $mJ/cm^2$, provided more than 10,000 good impressions on press.

EXAMPLE 9

Thermally sensitive printing plate precursors were prepared and press tested as follows. Aluminum sheets were slurry grained, alkaline etched, desmutted and anodized in a 20% phosphoric acid solution at 30–40° C. to provide an oxide weight of 1.7 $g/m^2$. The porous anodic surface exhibited average pore diameters in the range of about 35–40 nm. One of the anodized sheets was spin-coated with coating-1; another of the anodized sheets was spin-coated with coating-2. A third of the anodized sheets was treated with a polyacrylic acid (PAA) interlayer, prior to being spin-coated with coating-1. Each of the coated bases was imagewise exposed at 200–320 $mJ/cm^2$, developed and mounted on a sheet-fed printing press, as in example 6. The PAA interlayered and non-interlayered coating-1 plates, which contain 37-nm particles, provided about 100,000 and 120,000 clean impressions, respectively. About 150,000 clean impressions were obtained with the non-interlayered, coating-2 plate, which contains 15-nm particles.

EXAMPLE 10

Thermally sensitive lithographic printing plates, utilizing coating-1 and no interlayer, were prepared and press tested as described in example 9, except that the anodization time was varied to provide oxide weights of 1.7–2.5 $g/m^2$. About 125,000 clean impressions were obtained in each case.

EXAMPLE 11

Anodized sheets, described in Example 9, with and without PAA interlayer, were spin-coated with coating-3, which contains latex particles having average particle diameters of about 60 nm, imagewise exposed at 260–340 $mJ/cm^2$, developed and mounted on a sheet-fed printing press, as in Example 6. Less than 100 clean impressions of poor image quality were obtained with both plates with and without the PAA interlayer. The coated bases of Example 11 were imagewise exposed in the Creo 3244 imagesetter between 380–460 $mJ/cm^2$ in 20 $mJ/cm^2$ increments, developed and mounted on a sheet-fed printing plate, as described in Example 6. Both plates, which were imagewise exposed at the higher dose ranges, provided about 100,000 good impressions.

EXAMPLE 12

Thermally sensitive lithographic printing plates were prepared and press tested as described in Example 5, except that the aluminum sheets were slurry grained and the anodization time in 20% sulfuric acid solution was varied to provide oxide weights of 2.8 to 15 $g/m^2$. As in Example 5, the porous anodic surface exhibited average pore diameters in the range of about 10–20 nm. In each case, the anodized bases were then etched to about half of the original oxide weight, which resulted in an increase of surface oxide pore diameters by a factor of about 2. The etching process was carried out either in aqueous alkaline solution (5% sodium hydroxide) or in acidic solution (20% phosphoric acid). Coating-1 was then spin-coated on these bases, followed by imagewise exposure, development and press testing, as described in example 6. Each of the resulting plates provided about 120,000 clean impressions for exposures within the range of 200–320 $mJ/cm^2$.

Example 12 demonstrates that oxide pore size can be increased to provide long-running printing plates by a post anodic etch process. The average oxide pore size was in the range of about 30–40 nm. These experiments also demonstrate that the process of etching the anodized bases to about half of their original oxide weight provided optimal press life.

EXAMPLE 13

Thermally sensitive lithographic printing plates were prepared and press tested as follows. Aluminum sheets were electrolytically grained in 1-% hydrochloric acid, alkaline washed to remove the smut, and then anodized in 20% sulfuric acid at 30–40° C. to provide an oxide weight of 2.5 $g/m^2$, as described in Example 6. The porous anodic surface exhibited average pore diameters in the range of about 10–20 nm. Most of the oxide layer was etched with 20% phosphoric acid solution, followed by re-anodization in 20% sulfuric acid solution to provide an average pore size in the range of about 10–30 nm. One of the anodized sheets was hydrophilized with a sodium silicate solution. Another of the sheets was interlayered with a PVPA solution. Coating-4, which contains latex particles having average diameters of about 30 nm, as described in Example 14, was bar-coated onto each of these interlayered-bases, as well directly onto a base with no interlayer, to provide a coating weights of 2.0 $g/m^2$. The coated bases were imagewise exposed in a Creo Trendsetter 3244 imagesetter, utilizing a laser diode array emitting at 830 nm. A power setting of 10.5 W and variable drum speeds were used to expose each of the plate precursors in increments of 40 $mJ/cm^2$ between 240 and 320 $mJ/cm^2$. The exposed plate precursors were subsequently developed using developer 955 or Scorpio (both available from Kodak Polychrome Graphics) and mounted on a sheet-fed printing press. Less than 1,000 clean impressions were obtained with both of the interlayered plates, owing primarily to loss of adhesion. However, the plate with no interlayer provided about 100,000 clean impressions for exposures of 280 and 320 $mJ/cm^2$.

EXAMPLE 14

Coating-4 was prepared as follows. Acrylic resin solution ACR-1412 (described below) (5 g of a 40 wt % solution) was dissolved in methanol (10.8 g) by stirring for 15 min, followed by the addition of an aqueous ammonium hydroxide solution (0.39 g, 28 wt %) to neutralize the resin. Subsequently, an aqueous solution of IR dye, ADS-825WS (available from American Dye Source) (0.32 g dye dissolved in 26.8 g distilled water), was added. After stirring for 15 min, latex dispersion ACR-1410 (described below) (6.72 g) was slowly added, followed by stirring for an additional 30 min. Acrylic resin ACR-1412 was prepared as follows. A mixture of methyl methacrylate (19.1 g), methacrylic acid (3.3 g), ethyl acrylate (2.5 g), azoisobutyronitrile (0.5 g) and dodecylmercaptan (0.09 g) was heated at 80° C. in 2-methoxyethanol (153 g) under nitrogen, in a reaction vessel equipped with a dropping funnel and reflux condenser. Subsequently, a mixture of methyl methacrylate (57.4 g), methacrylic acid (10.2 g), ethyl acrylate (7.5 g), azoisobutyronitrile (1 g) and dodecylmercaptan (0.19 g) was added over a period of 2 hrs, followed by additional azoisobutyronitrile (0.25 g). After heating at 80° C. for 2 hrs, more azoisobutyronitrile (0.25 g) was added, follow by heating for an additional 2 hrs, after which the reaction was allowed to cool to room temperature. The acid number of the terpolymer of methyl methacrylate, methacrylic acid and ethyl acrylate was 88. Acrylic latex ACR-1410 was prepared as follows. A mix of initiator (potassium persulfate, 1.0 g), surfactant (sodium dodecyl sulfate, 1.0 g) and sodium bicarbonate (0.5 g) in distilled water (617 g) was stirred under nitrogen for 15 minutes at room temperature, followed by heating at 80° C. for 30–45 min. Methyl methacrylate (200 g) was added over a period of 90 min. After 1 hr, the reaction was complete, based on % non-volatiles. The reaction was heated for an additional 30 min. Brookfield viscosity at 25° C. was 30 cps; latex particle diameters were in the range of about 25–35 nm, as determined with a Microtac Utraline Particle Analyzer.

EXAMPLE 15

Thermally sensitive lithographic printing plates were prepared and press tested as described in Example 13 except that, following the etching step with 20% phosphoric acid solution, the aluminum base was re-anodized in 20% phosphoric acid solution. The average oxide pore size was in the range of about 30–40 nm. One of the anodized sheets was hydrophilized with a sodium silicate solution. Another of the sheets was interlayered with a PVPA solution. Coating-4 was bar-coated onto each of these interlayered-bases, as well directly onto a base with no interlayer, to provide coating weights of 2.0 $g/m^2$, followed by imagewise exposure, development and mounting on a sheet-fed printing press, as described in Example 12. The plates interlayered with silicate and PVPA each provided about 50,000 impressions clean impressions for exposures of 240 and 280 $mJ/cm^2$. The plate with no interlayer provided about 90,000 clean impressions for exposures of 280 and 320 $mJ/cm^2$.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A radiation-imageable element for lithographic printing comprising:

a hydrophilic anodized aluminum base having a surface comprising pores characterized by an average pore diameter; and coated thereon an image-forming layer comprising polymer particles characterized by an average particle diameter, the ratio of said average pore diameter to said average particle diameter being from 0.4:1 to 10:1.

2. The radiation-imageable element of claim 1, wherein said average pore diameter to said average particle diameter ratio is from about 0.5:1 to about 5:1.

3. The radiation-imageable element of claim 1, wherein said pores have an average pore diameter from about 10 to about 100 nm.

4. The radiation-imageable element of claim 1, wherein said average pore diameter is from about 10 to about 75 nm.

5. The radiation-imageable element of claim 1, wherein said polymer particles have an average particle diameter from about 1 to about 250 nm.

6. The radiation-imageable element of claim 1, wherein said polymer particles have an average particle diameter from about 10 to about 200 nm.

7. The radiation-imageable element of claim 1, wherein said polymer particles comprise a thermoplastic or thermoset polymer.

8. The radiation-imageable element of claim 1, wherein said image-forming layer further comprises a pigment.

9. The radiation-imageable element of claim 1, wherein said polymer particles comprise a graft polymer having a hydrophobic polymer backbone and a plurality of pendant groups represented by the formula:

-Q-W-Y wherein Q is a difunctional connecting group; W is selected from the group consisting of: a hydrophilic segment and a hydrophobic segment; Y is selected from the group consisting of: a hydrophilic segment and a hydrophobic segment; with the proviso that when W is a hydrophilic segment, Y is selected from the group consisting of: a hydrophilic segment and a hydrophobic segment, with the further proviso that when W is hydrophobic, Y is a hydrophilic segment.

10. The radiation-imageable element of claim 1, wherein said polymer particles comprise a homopolymer or a copolymer formed from polymerization of one or more monomers selected from the group consisting of: acrylic acid, methacrylic acid, acrylamide, methacrylamide, ester of acrylic acid, ester of methacrylic acid, hydroxyethyl acrylate, hydroxyethyl methacrylate, acrylamide, methacrylamide, N-hydroxyethyl acrylamide, N-hydroxyethyl methacrylamide, styrene, p-hydroxystyrene, α-methylstyrene, p-methylstyrene, vinyl acetate, methyl vinyl ether, ethyl vinyl ether, hydroxyethyl vinyl ether, vinylphosphonic acid, vinyl chloride, vinylidene chloride, acrylonitrile, N-vinyl pyrrolidone and N-vinyl carbazole.

11. The radiation-imageable element of claim 1, wherein said polymer particles comprise latex particles, phenol-formaldehyde resin, a cresol-formaldehyde resin, melamine-formaldehyde resin, a polyurethane resin and a combination thereof.

12. The radiation-imageable element of claim 1, wherein said polymer particles have a coagulation temperature of at least 40° C.

13. The radiation-imageable element of claim 12, wherein said coagulation temperature is at least 60° C.

14. The radiation-imageable element of claim 1, further comprising a photoconverter.

15. The radiation-imageable element of claim 14, wherein said photoconverter is a dye or pigment.

16. The radiation-imageable element of claim 14, wherein said photoconverter is selected from the group consisting of: an infrared absorbing dye, carbon black, a metal boride, a metal carbide, a metal nitride, a metal carbonitride, bronze-structured oxide and a conductive polymer particle.

17. The radiation-imageable element of claim 1, wherein said hydrophilic anodized aluminum base is an oxide base which comprises oxides and one or both of phosphates and sulfates of aluminum.

18. The radiation-imageable element of claim 17, wherein said oxide base is present in a coverage of greater than 100 milligrams per square meter of said hydrophilic anodized aluminum base.

19. The radiation-imageable element of claim 18, wherein said oxide base is present in a coverage of greater than 500 milligrams per square meter of said hydrophilic anodized aluminum base.

20. The radiation-imageable element of claim 1, further comprising an overlying layer.

21. The radiation-imageable element of claim 1, wherein the ratio of said average pore diameter to said avenge particle diameter is from about 0.95:1 to about 2.5:1.

22. The radiation-imageable element of claim 1, wherein said average pore diameter is from about 10 to about 40 nm.

23. The radiation-imageable element of claim 1, wherein said polymer particles have an average particle diameter from about 15 to about 60 nm.

24. The radiation-imageable element of claim 1, and further comprising an interlayer.

25. The radiation-imageable element of claim 24, wherein the interlayer comprises silicate, polyvinyl phosphoric acid, or polyacrylic acid.

26. A radiation-imageable element for lithographic printing comprising:

a hydrophilic anodized aluminum base having a surface comprising pores having an average pore diameter from about 10 to about 100 nm; and coated thereon an image-forming layer comprising polymer particles having an average particle diameter from about 1 to about 250 nm; the ratio of said average pore diameter to said average particle diameter being from about 0.5:1 to about 5:1.

27. The radiation-imageable element of claim 26, wherein said average pore diameter is from about 10 to about 75 nm.

28. The radiation-imageable element of claim 26, wherein said polymer particles have an average particle diameter from about 10 to about 200 nm.

29. The radiation-imageable element of claim 26, wherein said polymer particles comprise a thermoplastic or thermoset polymer.

30. The radiation-imageable element of claim 26, wherein said image-forming layer further comprises a pigment.

31. The radiation-imageable element of claim 26, wherein said polymer particles comprise a graft polymer having a hydrophobic polymer backbone and a plurality of pendant groups represented by the formula:

-Q-W-Y wherein Q is a difunctional connecting group; W is selected from the group consisting of: a hydrophilic segment and a hydrophobic segment; Y is selected from the group consisting of: a hydrophilic segment and a hydrophobic segment; with the proviso that when W is a hydrophilic segment, Y is selected from the group consisting of: a hydrophilic segment and a hydrophobic segment, with the further proviso that when W is hydrophobic, Y is a hydrophilic segment.

32. The radiation-imageable element of claim 26, wherein said polymer particles comprise a homopolymer or a copolymer formed from polymerization of one or more monomers selected from the group consisting of: acrylic acid, methacrylic acid, acrylamide, methacrylamide, ester of acrylic acid, ester of methacrylic acid, hydroxyethyl acrylate, hydroxyethyl methacrylate, acrylamide, methacrylamide, N-hydroxyethyl acrylamide, N-hydroxyethyl methacrylamide, styrene, p-hydroxystyrene, α-methylstyrene, p-methylstyrene, vinyl acetate, methyl vinyl ether, ethyl vinyl ether, hydroxyethyl vinyl ether, vinylphosphonic acid, vinyl chloride, vinylidene chloride, acrylonitrile, N-vinyl pyrrolidone and N-vinyl carbazole.

33. The radiation-imageable element of claim 26, wherein said polymer particles comprise latex particles, phenol-formaldehyde resin, a cresol-formaldehyde resin, melamine-formaldehyde resin, a polyurethane resin and a combination thereof.

34. The radiation-imageable element of claim 26, wherein the ratio of said average pore diameter to said average particle diameter being from about 0.95:1 to about 2.5:1.

35. The radiation-imageable element of claim 26, wherein said average pore diameter is from about 10 to about 40 nm.

36. The radiation-imageable element of claim 26, wherein said polymer particles have an average particle diameter from about 15 to about 60 nm.

37. The radiation-imageable element of claim 26, and further comprising an interlayer.

38. The radiation-imageable element of claim 37, wherein the interlayer comprises silicate, polyvinyl phosphonic acid, or polyacrylic acid.

39. The radiation-imageable element of claim 26, wherein said hydrophilic anodized aluminum base is an oxide base which comprises oxides and one or both of phosphates and sulfates of aluminum.

40. The radiation-imageable element of claim 39 wherein said oxide base is present in a coverage of greater than 100 milligrams per square meter of said hydrophilic anodized aluminum base.

41. The radiation-imageable element of claim 39, wherein said oxide base is present in a coverage of greater than 500 milligrams per square meter of said hydrophilic anodized aluminum base.

42. A method of producing an imaged element for lithographic printing comprising the steps of:

providing a hydrophilic anodized aluminum base having a surface comprising pores characterized by an average pore diameter;

coating thereon an image-forming layer comprising polymer particles characterized by an average particle diameter, the ratio of said average pore diameter to said average particle diameter being from 0.4:1 to 10:1; and imagewise exposing said image-forming layer to radiation to produce exposed and unexposed regions.

43. The method of claim 42, wherein said radiation is thermal radiation.

44. The method of claim 43, wherein said step of exposing said image-forming layer to thermal radiation is carried out using an infrared laser.

45. The method of claim 42, further comprising postbaking said imaged element.

46. An imaged element prepared by the method of claim 42.

47. The method of claim 42, wherein the step of providing the anodized aluminum base comprises anodizing an aluminum base in phosphoric acid.

48. The method of claim 42, wherein the step of providing the anodized aluminum base comprises anodizing an aluminum base in sulfuric acid.

49. The method of claim 42, wherein the step of providing the anodized aluminum base comprises etching the anodized aluminum base to increase the average pore diameter.

50. The method of claim 42, and further including the step of forming an interlayer on the anodized aluminum base.

51. A method of producing an imaged element having complementary ink receiving and ink rejecting regions, said method comprising the steps of:

providing a radiation-imageable element for lithographic printing comprising: a hydrophilic anodized aluminum base having a surface comprising pores; and coated thereon, a image-forming layer comprising polymer particles, the ratio of said average pore diameter to said average particle diameter being from about 0.4:1 to about 10:1;

imagewise exposing said image-forming layer to radiation to produce exposed and unexposed regions; and contacting said imagewise exposed image-forming layer and a developer to selectively remove said exposed or said unexposed regions.

52. The method of claim 51, wherein said contacting selectively removes said unexposed regions.

53. An imaged element prepared by the method of claim 51.

* * * * *